(12) United States Patent
Tuennermann et al.

(10) Patent No.: US 8,778,121 B2
(45) Date of Patent: Jul. 15, 2014

(54) METHOD FOR LASER-ASSISTED BONDING, SUBSTRATES BONDED IN THIS MANNER AND USE THEREOF

(75) Inventors: Andreas Tuennermann, Weimar (DE); Ramona Eberhardt, Bucha (DE); Gerhard Kalkowski, Jena (DE); Stefan Nolte, Jena (DE)

(73) Assignees: Fraunhofer-Gesellschaft zur der Andewandten, Munich (DE); Friedrich-Schiller-Universtaet Jena, Jena (DE)

( * ) Notice: Subject to any disclaimer, the term of this patent is extended or adjusted under 35 U.S.C. 154(b) by 915 days.

(21) Appl. No.: 12/449,614

(22) PCT Filed: Feb. 21, 2008

(86) PCT No.: PCT/EP2008/001362
§ 371 (c)(1),
(2), (4) Date: May 3, 2010

(87) PCT Pub. No.: WO2008/101699
PCT Pub. Date: Aug. 28, 2008

(65) Prior Publication Data
US 2010/0304151 A1    Dec. 2, 2010

(30) Foreign Application Priority Data

Feb. 21, 2007   (DE) .................. 10 2007 008 540

(51) Int. Cl.
*B29C 65/16* (2006.01)
(52) U.S. Cl.
CPC ..................................... *B29C 65/16* (2013.01)
USPC ........................................................ 156/272.8

(58) Field of Classification Search
CPC .... B32B 17/06; B29C 65/16; B29C 65/1632; B29C 65/1635; B29C 16/1638
USPC ............................................ 156/272.2, 272.8
See application file for complete search history.

(56) References Cited

U.S. PATENT DOCUMENTS

| | | | |
|---|---|---|---|
| 4,822,451 A * | 4/1989 | Ouderkirk et al. ............... 216/62 |
| 5,279,693 A * | 1/1994 | Robinson et al. ........... 156/272.8 |
| 2003/0071269 A1 | 4/2003 | Tseng |
| 2003/0221765 A1* | 12/2003 | Guilhem et al. ................. 156/93 |
| 2004/0082145 A1 | 4/2004 | Reichenbach et al. |
| 2004/0112518 A1* | 6/2004 | Rossier et al. ............. 156/272.2 |

FOREIGN PATENT DOCUMENTS

| | | |
|---|---|---|
| DE | 197 52 412 A1 | 5/1998 |
| DE | 100 48 374 B4 | 4/2001 |
| EP | 0 232 935 A1 | 8/1987 |

(Continued)

OTHER PUBLICATIONS

Witte R et al. : "Laser Joining of Glass with Silicon" Proceedings of the SPIE, SPIE, Bellingham, VA vol. 4637, Jan. 21, 2002.*

(Continued)

*Primary Examiner* — Daniel McNally
(74) *Attorney, Agent, or Firm* — Marshall & Melhorn, LLC

(57) ABSTRACT

The present invention relates to a method for laser-assisted bonding of substrates, in which these are connected together firstly frictionally by pressing together and subsequently strengthening of the connection between the substrates is effected by activation in regions which is induced by laser irradiation. The invention likewise relates to substrates produced accordingly.

23 Claims, 5 Drawing Sheets

(56) References Cited

FOREIGN PATENT DOCUMENTS

| EP | 0 539 741 A1 | | 5/1993 |
|---|---|---|---|
| EP | 539741 A1 | * | 5/1993 |
| EP | 0 621 130 A2 | | 10/1994 |
| EP | 1 346 949 A2 | | 9/2003 |

OTHER PUBLICATIONS

Witte, Reiner, et al.; Laser Joining of Glass with Silicon; Proceedings of the SPIE, SPIE, Bellingham, VA, vol. 4637, Jan. 21, 2002; pp. 487-495; XP001156588.

Gilner, A., et al.; Laser Bonding of Micro Optical Components; Proceedings of the SPIE, SPIE, Bellingham, VA, vol. 4941, Oct. 30, 2002; pp. 112-120; XP001156860.

Yang, H.T., et al; Laser Bonding for Non-Lattice Matched Stacked Cells; Fifteenth IEEE Photovoltaic Specialists Conference; May 12-15, 1981; 1981; pp. 1357-1362; XP008095018.

Schaffer, Chris B., et al.: Laser-induced breakdown and damage in bulk transparent materials induced by tightly focused femtosecond laser pulses; Measurement Science and Technology; Oct. 9, 2001, vol. 12, pp. 1784-1794.

* cited by examiner

METHOD FOR LASER-ASSISTED BONDING, SUBSTRATES BONDED IN THIS MANNER AND USE THEREOF

BACKGROUND OF THE INVENTION

The invention relates to a method for laser-assisted bonding of substrates, in which these are connected together firstly frictionally by pressing together and subsequently strengthening of the connection between the substrates is effected by activation in regions which is induced by laser irradiation. The invention likewise relates to substrates produced accordingly.

Direct bonding or wafer bonding known from the state of the art is based on the principle that surfaces with sufficient planarity can be connected together because of adhesion forces. This direct bonding is effected at temperatures in the range of room temperature up to $T_G$ point or up to melting point. Methods of this type are known for example from DE 197 52 412 A1 and DE 100 48 374 A1.

However, at room temperature, direct bonding provides only a weak connection between substrates and normally must be supplemented by subsequent tempering at increased temperatures in order to achieve sufficient adhesion strengths of the joined parts. Therefore normally only at temperatures of above 300° C. can a significant increase in adhesion forces and hence strengthening of the connection be achieved. A substantial disadvantage of the temperature treatment however affects substrates which have a different thermal expansion behaviour.

BRIEF SUMMARY OF THE INVENTION

It was thereby the object of the present invention to provide a method for the connection of planar substrates, which can be used also for materials which thermally are not particularly resilient and materials with different expansion behaviour and nevertheless enables high adhesive strength between the substrates.

This object is achieved by the method having the features of claim 1 and the bonded substrates having the features of claim 24. Uses according to the invention are indicated in claims 26 and 27. The further dependent claims reveal advantageous developments.

According to the invention, a method for the laser-assisted bonding of substrates is provided, in which two substrates are connected together frictionally in a first step by being brought in direct contact and possibly pressed together and strengthening of the connection between the substrates is effected subsequently by activation in regions which is induced with laser irradiation at the interface between the substrates. Of course, also more than two substrates can be connected together according to this method.

In the mentioned method, the strengthening of the connection is essential to the invention in the second step which is induced by laser irradiation, the laser energy however being chosen such that the melting or transformation temperature of the substrates is not reached during the activation. As a result of the fact that the melting temperature is not reached, the shape of the surface of the substrates is maintained unaltered. No transition from the solid to the liquid phase occurs, rather the supplied energy is converted into electronic excitation of the surface atoms/molecules. Excitation of electrons thereby occurs from the occupied orbitals in the basic condition into unoccupied orbitals in the excited condition. A high chemical reactivity which can lead to the formation of new chemical bonds at the contact points of the two substrates is associated herewith. By relaxation of the electronic excitation conditions, energy is also transferred into the solid lattice which can lead to further approach of the adjacent substrates and formation of new chemical bonds (reactions) between the surface atoms/molecules of both substrates via oscillation excitation of the surfaces.

Preferably, a chemical and/or a thermal excitation of molecules and/or atoms in at least one of the substrates is made possible in the region of the interface by means of the laser irradiation and/or initiates diffusion processes in at least one of the substrates in the region of the interface.

A preferred embodiment of the method according to the invention provides that the laser irradiation is pulsed in order to enable a defined input of energy into the substrates.

Precise focusing of the laser irradiation on the interface is likewise preferred.

With respect to implementation of the method, the following three variants can be used.

According to a first variant, the wavelength of the laser irradiation is coordinated such and the focusing of the laser irradiation is chosen such that the first substrate is irradiated and subsequently excitation of bonding conditions of the molecules and/or atoms of at least one substrate is effected only in the region of the interface. Precise localisation is hereby made possible in that the laser irradiation is focused on defined regions. The activation energy and hence also the degree of strengthening of the connection between the substrates can be adjusted via the parameters focusing, pulse energy, pulse repetition rate and number of pulses of the laser irradiation.

A second variant according to the invention provides that substrates, which are essentially transparent at a wavelength $\lambda \geq \lambda_a$, are irradiated with longwave, non-linearly absorbing laser irradiation of the wavelength $\lambda \geq \lambda_a$. By means of a correspondingly precise focusing of the laser irradiation on the interface, the result is multiproton processes if a sufficiently high intensity of the laser irradiation is reached. The activation energy and hence the degree of strengthening of this kind of connection can be adjusted via the focusing, the pulse duration, the pulse energy, the pulse repetition rate and the number of pulses of the laser irradiation.

Instead of a laser, also several lasers with different wavelengths $\lambda_{Laser1}$, $\lambda_{Laser2}$, $\lambda_{Laser3}$ etc. can also be used, which are all greater than $\lambda_a$.

A third variant according to the invention of the method provides that a first substrate which is essentially transparent for the radiated laser irradiation of a defined wavelength and a second substrate which essentially absorbs laser irradiation of this wavelength are used. During the irradiation, the laser irradiation then firstly passes through the transparent substrate without absorption resulting. Only when impinging on the second substrate is the result then absorption processes and the thermal activation associated therewith.

Control of the resulting heat input is effected via the suitable choice of focusing, wavelength, pulse duration, pulse energy and also the pulse repetition rate and the duration of the irradiation, i.e. the number of pulses. The heat transport and hence the heated volume thereby depend greatly upon the pulse duration. When using ultrashort pulses, i.e. in the pico- to femto-second range, extensive heat propagation can be avoided. In the case of a high pulse sequence frequency, heat accumulation can nevertheless result. In this case, the temperature is increased successively with the number of pulses. However, the heated area can also become greater than the focus as a result.

There can be used as substrates both amorphous, partly crystalline or crystalline substrates. From the group of amorphous substrates, glasses, in particular silicon dioxide, are preferred. There are used preferably as partly crystalline substrates, glass ceramics, e.g. Zerodur® or ULE®. The crystalline substrates are selected preferably from the group consisting of semiconductors, ceramics, piezoceramics, non-linear optical crystals. As semiconductors, in particular silicon, indium phosphide or gallium arsenide are preferred here. Amongst the piezoceramics, barium titanate or lead zirconate titanate are particularly preferred. There are used as non-linear optical crystals in particular potassium titanyl phosphate, lithium niobate, barium diborate or lithium triborate. Plastic materials can likewise be used as substrates. From the group of plastic materials, in particular polymethylmethacrylate, polycarbonate or polymers and copolymers or cycloolefins and also composite materials thereof are preferred here.

The method according to the invention is suitable in particular in the case where two different substrates are used. In particular substrates with different thermal coefficients of expansion can hereby be involved. However it is likewise possible that two substrates made from the same materials are used. With respect to the substrates, those with as planar a surface as possible should be used.

The requirements for flatness and roughness depend upon the substrate material and the flexibility thereof. The flatness requirements basically increase notably with increasing flexural strength of the substrate, in particular with increasing substrate height.

In order to bond two glass substrates with respectively a height of approx. 1 mm, the local flatness over a surface section of approx. 20 mm*20 mm should preferably be approx. 10 nm (PV=Peak to Valley) or better. This value represents however merely a rough criterion. Deviations of approx. one order of magnitude downwards or upwards are possible, according to the material, substrate height and process control (contact pressure etc.). Basically greater unevenness can be tolerated with smaller substrate heights.

The roughness of the surface should preferably be ≤1 nm (RMS=Root Mean Square), but at least ≤5 nm (RMS).

Prerequisites of this type with respect to the planarity of the surface can, if not provided from the beginning, be reached for example by preceding processing and cleaning steps in order to remove particles and dirt. There are possible also as further pre-treatment steps plasma activation of the surfaces, e.g. low- or high-pressure plasma treatment with nitrogen, oxygen, hydrogen or argon, and also adsorption of functional groups, e.g. $SO_2$, $NH_3$, on the surface. All the pre-treatment steps mentioned here, i.e. the cleaning, the plasma activation and the adsorption of functional groups, can be implemented in any sequence.

It is likewise possible that the method according to the invention takes place in an integrated construction in which the bonding and subsequent laser activation are implemented, in order to eliminate interim environmental influences, in the same unit, particularly preferred in a vacuum, or else under protective gas.

Furthermore, it is preferred to achieve linear or planiform strengthening of the connection between the substrates by means of laser activation of adjacent regions.

A preferred variant of the method according to the invention provides that the bonding is implemented by the known direct bonding with the process steps of cleaning of the substrate, plasma activation of the substrate surface and pressing the substrates one upon the other.

A variant of the method according to the invention provides that two smooth, flat substrates are placed directly one upon the other so that the spacings between the two substrates assume partly atomic dimensions, i.e. up to 1 nm. Preferably, this can be effected via direct bonding, however the possibility also exists, in the case of sufficiently small, flat and clean surfaces, to achieve sufficiently small spacings simply by placing one on the other and pressing together or wringing together, as is practised in optics.

In a second step, laser irradiation is focused then on the interface, as a result of which the latter achieves its highest intensity as precisely as possible at the interface.

By focusing the laser irradiation on the interface between the substrates, the intensity there becomes so high that a non-linear absorption occurs there. This can be attributed to multiphoton processes, i.e. the combination of two or more photons. A non-linear absorption is the combination of a plurality of photons of the same wavelength or the combination of a plurality of photons of a different wavelength which leads to an energy gap being overcome which would not be able to be overcome for each individual photon. Absorption processes of this type are intensity-dependent. Therefore 2-photon processes are proportional to the square of the intensity, 3-photon processes are proportional to the third power of the intensity etc. The non-linear absorption is hence dependent upon the focusing conditions or the intensity of the laser irradiation in the focus. In addition, material-specific influence factors, such as the local crystal symmetry, are involved. In the case of high intensity of the laser irradiation, apart from multiphoton absorption, also influencing the electronic structure of the substrates is possible, e.g. band distortion, energy displacement of interface conditions which can possibly assist the absorption and hence the energy input into the material. Furthermore, care should be taken that electrons once excited in the conduction band absorb further laser irradiation very efficiently and can issue their energy rapidly to the substrates via impact processes.

Which laser intensity is required for non-linear absorption in glasses and how an adequate intensity can be achieved is known for example from C. Schaffer et al., "Laser-induced breakdown and damage in bulk transparent materials induced by tightly focused femtosecond laser pulses", Meas. Sci. Technol. 12 (2001), 1784-1794. At a pulse duration of approx. 100 fs and a wavelength of 800 nm, the intensity threshold for the optical breakthrough (i.e. when so many electrons have been excited from the valency band into the conduction band that the glass is no longer transparent) lies at the order of magnitude of $10^{13}$ W/cm$^2$.

The cited example should however provide only an approximate criterion. Sufficient activation can take place entirely with fewer released electrons, i.e. be effected already at an intensity which is less by one to two orders of magnitude. In addition, the band gap can become smaller due to defects, surface bonds etc. Furthermore, care must be taken that, in the case of some special materials, e.g. in the case of colourants which in fact can be contained in the substrates, intensities of kW/cm$^2$ can in fact be adequate.

Hence the route described in the above publication is only one for experimental production of the required intensity. For experts in laser technology, various variations of the adjustment parameters are immediately obvious, which lead to a comparable intensity or similar energy input by absorption.

According to the invention, bonded substrates which have been produced according to the above-described method are likewise provided.

The method according to the invention is applied inter alia in the production of high power components for beam formation. There should be understood herewith both the deflection, the scattering and the focusing of radiation. Typical applications from this field are the joining of prisms or the sealing of lattices. A further use according to the invention relates to the production of adhesive-free precision connections. There should be understood herewith mechanically stable connections without an inorganic or organic intermediate layer. Likewise included herein are electrooptic modulators.

A further example of a use according to the invention relates to so-called hybrid integration. There should be understood by hybrid integration the connection of different materials to form a functional unit. This relates for example to the connection of silicon (microelectronics) and GaAs (optics) to form optoelectronic components. However also the connection of optoelectronic components with structured elements made of glass or transparent plastic material (microlens arrays) or even the connection of optical glass- and plastic material elements can be subsumed within the term of hybrid integration. A substantial problem with hybrid integration frequently is the different thermal expansion of the materials involved, which requires a correspondingly adapted constructional configuration of the connection.

BRIEF DESCRIPTION OF THE DRAWINGS

The method according to the invention is intended to be explained in more detail with reference to the subsequent Figures without wishing to restrict said method to the special embodiments shown here.

DETAILED DESCRIPTION OF THE INVENTION

Figure 1:
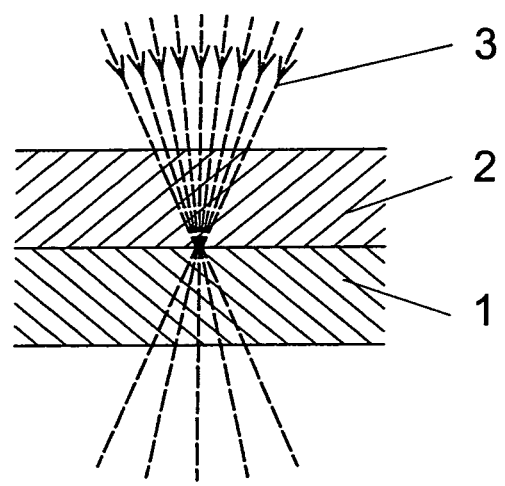
FIG. 1 shows, with reference to a schematic representation, how laser irradiation is focused on the interface of the substrates.

The focusing of the laser irradiation is illustrated schematically in FIG. 1, the laser irradiation 3 firstly passing through the substrate 2 and being focused on the interface to the substrate 1.

The laser irradiation penetrates the first substrate because it is more longwave, i.e. lower energy, than required for a linear absorption. This means that the photon energy does not suffice for overcoming the energy gap between valency band and conduction band of the substrate material. Hence the substrate 2 is transparent for the laser irradiation on the radiated wavelength.

Figure 2:
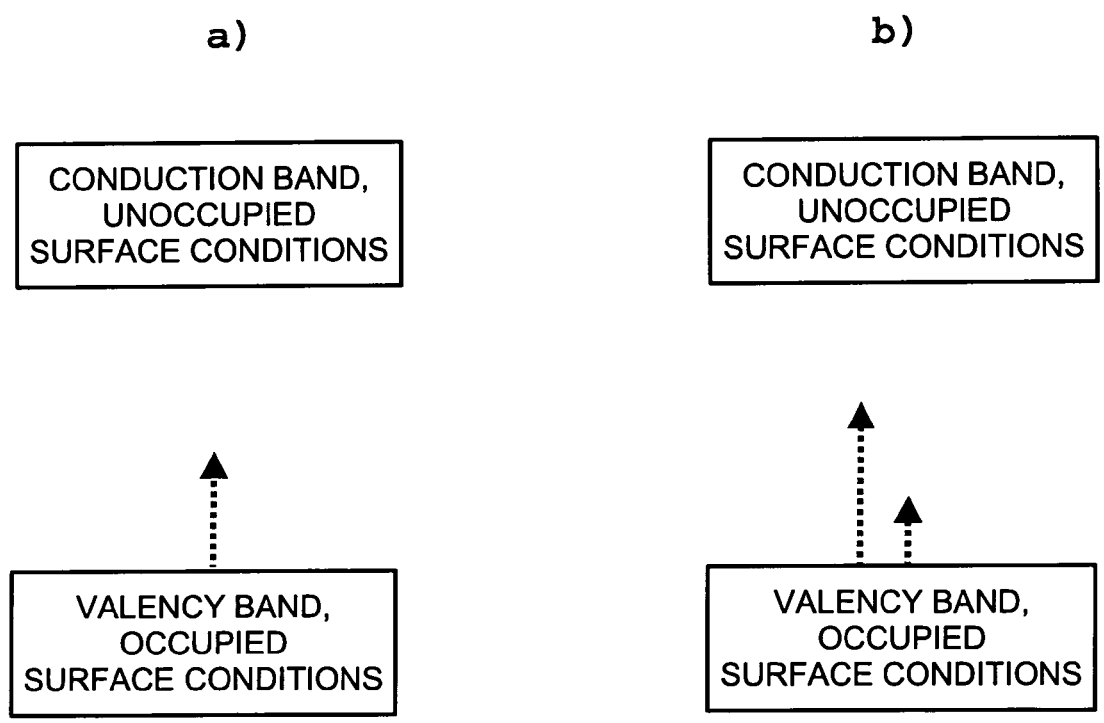
FIG. 2 shows schematic representations of the energy conditions out with the focus or with low laser intensity for a radiated laser wavelength (a) or for two different laser wavelengths (b).

In FIGS. 2a) and 2b), it is illustrated schematically that the laser wavelengths radiated here (illustrated by arrows) do not suffice to overcome the gap between both bands, i.e. the occupied and the unoccupied condition.

Figure 3:
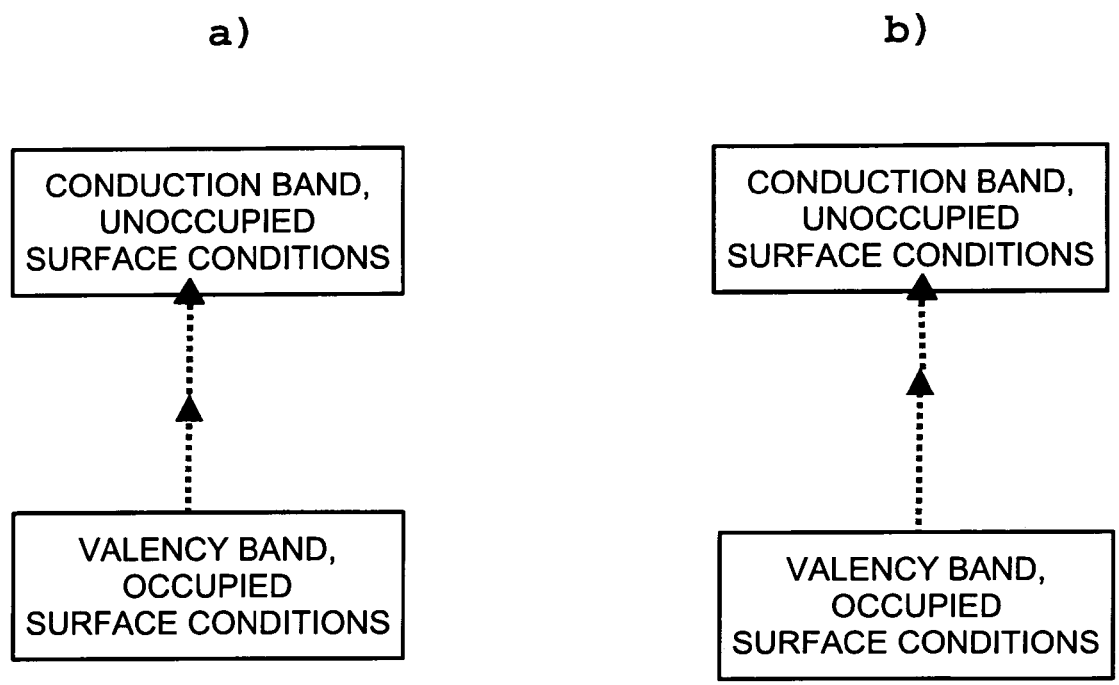
FIG. 3 shows a schematic representation of the energy conditions within the focus or at high laser intensity for a radiated laser wavelength (a) or for two different laser wavelengths (b).

In FIGS. 3a) and 3b), the energy conditions within the focus at a single radiated laser wavelength (FIG. 3a)) and at two different laser wavelengths (FIG. 3b)) are represented. The combination of the photon energies suffices to overcome the energy gap between the occupied and the unoccupied conditions. A non-linear absorption and energy input in the interface takes place.

The excited condition leads to a chemical reaction which changes the bonding conditions between the substrates and ultimately leads to a stronger bond/adhesion of the substrates to each other.

Figure 4:
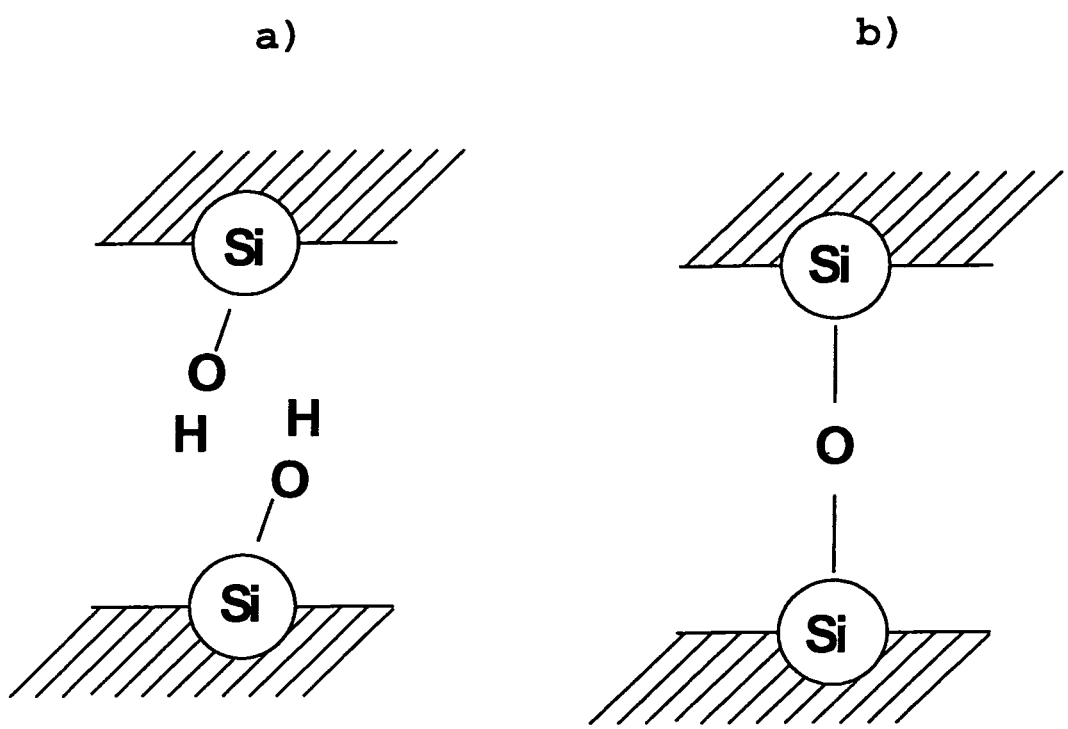
FIG. 4 shows, by way of example, a first surface reaction of the substrates activated with the laser.

In FIG. 4, possible surface reactions of the substrates activated with the laser are illustrated. FIG. 4a) hereby shows the surface of a glass before activation with laser irradiation. Thus silicon valencies on the surface of a glass are frequently saturated initially by OH groups, i.e. the glass has a hydrophilic character. A chemical reaction which leads to an oxygen bridge bond between the silicon atoms in the form of a stable covalent bond and condensation of water is initiated by the laser activation (FIG. 4b)). The resulting $H_2O$ molecule can be transported away firstly from the interface e.g. by diffusion and reach the outside or react further at another point.

Figure 5:
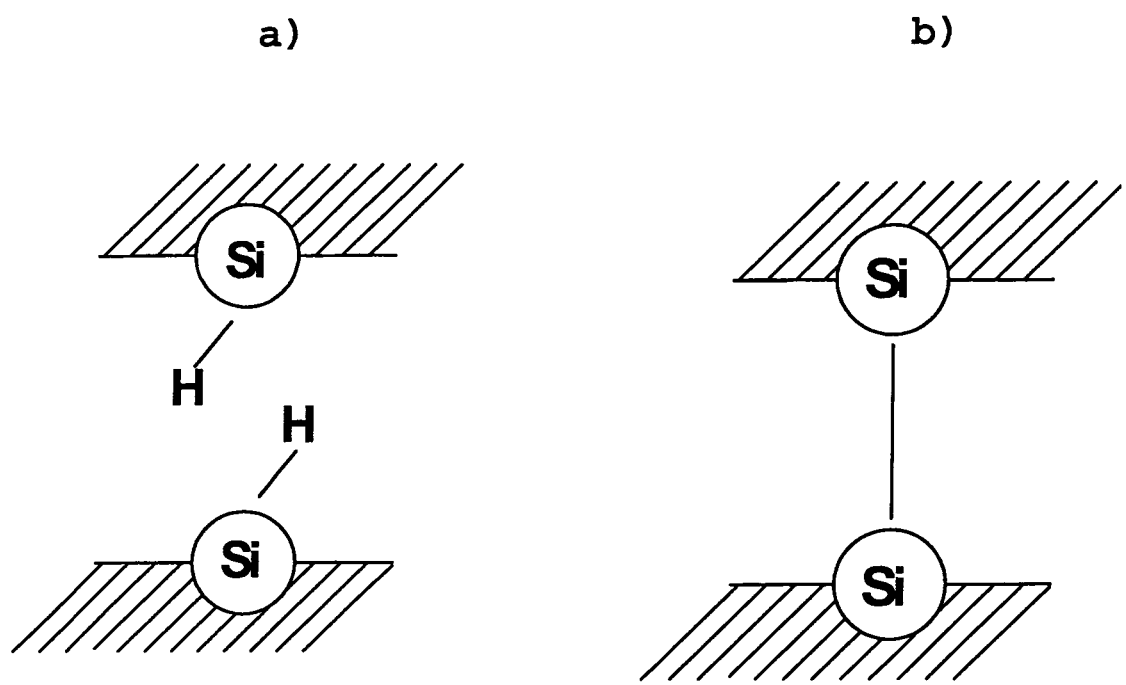
FIG. 5 shows, by way of example, a second variant for a surface reaction of the substrates activated with the laser.

In FIG. 5, a second surface reaction is represented, by way of example. FIG. 5a) hereby shows the surface of a glass which is saturated by H-atoms before activation with the laser irradiation. The glass here is hydrophobic. By means of the laser activation, cleavage of the H atoms is initiated and two adjacent Si atoms react directly with each other with formation of a covalent Si—Si bond (stable covalent bond). The resulting $H_2$ molecule can be transported away from the interface correspondingly by diffusion and reach the outside or react further at another point.

Analogue reactions are not conceivable for OH or H but are for other functional groups on the surface. Correspondingly, also other substrate materials in addition to silicon are suitable.

The invention claimed is:

1. A method for laser-assisted bonding of substrates, in which two substrates are connected together by being brought in direct contact and strengthening of the connection between the substrates is effected subsequently by activation in regions which is induced with laser irradiation at an interface between the substrates, the melting or transformation temperature of the substrates not being reached during the activation, wherein a chemical excitation of the molecules and/or atoms of at least one substrate is effected in the region of the interface by means of the laser irradiation, wherein the two substrates are essentially transparent for a radiated laser irradiation with a wavelength $\lambda_a$, and are irradiated with laser irradiation of a longwave, non-linearly absorbing wavelength, and multiphoton processes are initiated by precise focusing with correspondingly high intensity of the laser irradiation and an activation energy and hence a degree of strengthening of the connection is adjusted via focusing, wavelength, pulse duration, pulse energy, pulse repetition rate and a number of pulses of the laser irradiation.

2. The method according to claim 1, wherein the substrates are amorphous, partly crystalline and/or crystalline.

3. The method according to claim 2, wherein the substrates are amorphous and are selected from a group consisting of glasses.

4. The method according to claim 3, wherein the amorphous substrates are comprised of silicon dioxide.

5. The method according to claim 3, wherein glass ceramics are used as partly crystalline substrates.

6. The method according to claim 3, wherein semiconductors, ceramics, piezoceramics and/or non-linear optical crystals are used as crystalline substrates.

7. The method according to claim 1, wherein the laser irradiation is focused on the interface between the substrates.

8. The method according to claim 7, wherein the wavelength of the laser irradiation is coordinated to at least one substrate and a focusing of the laser irradiation is chosen such that excitation of bonding conditions of the molecules and/or atoms of at least one substrate is effected specifically in the region of the interface and an activation energy and hence a degree of strengthening of the connection is adjusted via focusing, pulse energy, pulse repetition rate and a number of pulses of the laser irradiation.

9. The method according to claim 1, wherein the substrates are selected from a group consisting of plastic materials.

10. The method according to claim 9, wherein the plastic materials are selected from a group consisting of polymethylmethacrylate, polycarbonate, polymers and copolymers of cycloolefins, and composite materials thereof.

11. The method according to claim 1, wherein two different substrates are used.

12. The method according to claim 11, wherein the substrates have a different thermal coefficient of expansion.

13. The method according to claim 1, wherein additionally a thermal excitation of the molecules and/or atoms of the at least one substrate is effected in the region of the interface by means of the laser irradiation and/or diffusion processes are initiated in at least one substrate in the region of the interface.

14. The method according to claim 1, wherein the laser irradiation is pulsed.

15. The method according to claim 1, wherein two substrates made of the same material are used.

16. The method according to claim 1, wherein the substrates are connected together frictionally by pressing together.

17. The method according to claim 1, wherein the laser activation is implemented in a protective gas atmosphere or in a vacuum.

18. The method according to claim 1, wherein the surfaces of the substrates to be connected are cleaned in advance.

19. The method according to claim 1, wherein a plasma activation of the surfaces of the substrates to be connected is effected in advance.

20. The method according to claim 1, wherein functionalisation of the surfaces of the substrates to be connected is effected in advance.

21. The method according to claim 1, wherein linear or planiform strengthening are effected by means of activation of adjacent regions.

22. The method according to claim 1, wherein the bonding is effected by direct bonding with the process steps cleaning, plasma activation and pressing together.

23. The method according to claim 1, wherein all the method steps are implemented in the same unit.

\* \* \* \* \*